United States Patent [19]

Knepper

[11] 4,093,875

[45] June 6, 1978

[54] FIELD EFFECT TRANSISTOR (FET) CIRCUIT UTILIZING SUBSTRATE POTENTIAL FOR TURNING OFF DEPLETION MODE DEVICES

[75] Inventor: Ronald William Knepper, La Grangeville, N.Y.

[73] Assignee: International Business Machines Corporation, Armonk, N.Y.

[21] Appl. No.: 764,494

[22] Filed: Jan. 31, 1977

[51] Int. Cl.[2] ...................... H03K 17/60; H03K 17/04

[52] U.S. Cl. .................................... 307/251; 307/264; 307/DIG. 1; 307/DIG. 4

[58] Field of Search ............... 307/205, 214, 251, 270, 307/264, 246, DIG. 1, DIG. 4

[56] References Cited

U.S. PATENT DOCUMENTS

| | | | |
|---|---|---|---|
| 3,912,948 | 10/1975 | Bapat | 307/DIG. 4 X |
| 3,938,108 | 2/1976 | Salsbury et al. | 307/DIG. 4 X |
| 3,995,172 | 11/1976 | Freeman et al. | 307/205 |
| 4,016,476 | 4/1977 | Morokawa et al. | 307/DIG. 1 X |

OTHER PUBLICATIONS

Hsu, "True, Push-Pull Driver;" *IBM Tech. Discl. Bull.;* vol., 19, No. 3, pp. 998–999; 8/1976.

Chu et al., "Bootstrap Push-Pull Driver," *IBM Tech. Discl. Bull.;* vol. 18, No. 3, pp. 710–711; 8/1975.

Aoki et al., "Field-Effect Transistor Driver Circuit," *IBM Tech. Discl. Bull.*; vol. 17, No. 7, pp. 2066–2067; 12/1974.

Pi et al., "Driver Using Unity-Gain Design in Active State," *IBM Tech. Discl. Bull.;* vol. 19, No. 6, p. 2132; 11/1976.

*Primary Examiner*—Larry N. Anagnos

*Attorney, Agent, or Firm*—Theodore E. Galanthay

[57] ABSTRACT

Disclosed is a field effect transistor (FET) circuit utilizing three sources of potential, the third source of potential being derived from the substrate. An input stage, connected between first and second sources of potential, is adapted to receive a logic input signal approximating said first and second sources of potential. An output stage connected between the first source of potential and a third source of potential, is adapted to provide a logical output signal approximating said first and third sources of potential. The third source of potential, which is derived from the substrate, provides a potential level suitable for turning off depletion mode FET devices.

18 Claims, 3 Drawing Figures

+V
T1
T6
T3
+V
0
A
N1
CB
N3
+V
0
B
T2
T7
V OUT
+V
N2
V SUB
T5
V SUB
T4
CL
V SUB
V SUB

FIELD EFFECT TRANSISTOR (FET) CIRCUIT UTILIZING SUBSTRATE POTENTIAL FOR TURNING OFF DEPLETION MODE DEVICES

CROSS REFERENCE TO RELATED APPLICATIONS AND PUBLICATIONS

R. W. Knepper, "Enhancement/Depletion Mode Field Effect Transistor Driver," IBM Technical Disclosure Bulletin, Volume 19, Number 3, August, 1976, Page 922-3.

R. W. Knepper, "Enhancement/Depletion Mode Field Effect Transistor Driver," application Ser. No. 745,735, filed in the U.S. Patent and Trademark Office on Nov. 29, 1976, and assigned to the assignee of the present invention.

BACKGROUND OF THE INVENTION

1. Field of the Invention

This invention relates to an improved field effect transistor circuit and more particularly to an enhancement/depletion mode FET circuit for providing an output voltage swing suitable for turning off depletion mode FET devices.

2. Description of the Prior Art

The use of both enhancement mode and depletion mode field effect transistors on a common semiconductor substrate is well-known. As an example of such circuits, the publication and patent application by the present inventor are cross referenced herein.

A known advantage of depletion mode field effect transistor devices is that the "threshold voltage" drop associated with enhancement mode field effect transistor devices is eliminated. The advantages of "switched" depletion mode devices over self-biased depletion mode devices include positive timing control and reduced rise delay. On the other hand, a known disadvantage of depletion mode field effect transistor devices is that they are not turned "off" by the same gate to source bias that normally turns enhancement mode field effect transistors "off." Thus, the advantage of "threshold voltage" drop elimination goes hand in hand with the disadvantage that a zero gate to source bias does not completely prevent the flow of current through a depletion mode FET.

It is known in the prior art that the threshold voltage of n-channel FET devices may be adjusted by the application of a negative bias voltage to the substrate. For example, see Pleshko, U.S. Pat. No. 3,609,414. The substrate bias voltage, however, is not utilized by the logic circuitry to provide an output signal swing that is different from that of the input voltage swing. Utilization of the substrate bias voltage for the purpose of turning off depletion mode FET devices has not been considered by the known prior art.

SUMMARY OF THE INVENTION

Accordingly, it is an object of this invention to provide an improved FET circuit that utilizes the substrate voltage as a third source of potential.

Another object of this invention is to provide a logic voltage swing suitable for turning off depletion mode FET devices.

It is a still further object of this invention to provide an improved circuit having both enhancement and depletion mode field effect transistors.

Accordingly, there is disclosed a logic level converting field effect transistor circuit having both enhancement mode field effect transistors and depletion mode field effect transistors. An input stage consists of a push-pull amplifier including a first pair of field effect transistors connected in electrical series between a first source of potential (+V) and a second source of potential (ground potential) for receiving both the true and complement values of the input logic signal. A push-pull input stage is preferred for its greater speed. It is recognized, however, that a self-biased load device could be used, particularly if both true and complement phases of the input are not available. The output stage connected between +V and a third source of potential (the substrate voltage) which is more negative than ground potential, includes a second pair of series connected field effect transistors and provides a down level at or near the substrate voltage level. This down level is sufficiently low to turn off depletion mode devices in subsequent stages. The circuitry coupling the input and output stages is designed for maximum speed and minimum power consumption. Features of the coupling circuit include capacitive coupling and, in one embodiment, a bootstrap circuit consisting of a capacitor and a depletion mode field effect transistor connected in series between the output node and the gate of one of the second pair of series connected field effect transistors.

The foregoing and other objects, features and advantages of this invention will be apparent from the following and more particular description of the preferred embodiments of the invention, as illustrated in the accompanying drawings.

DESCRIPTION OF THE PREFERRED EMBODIMENT

Figure 1:
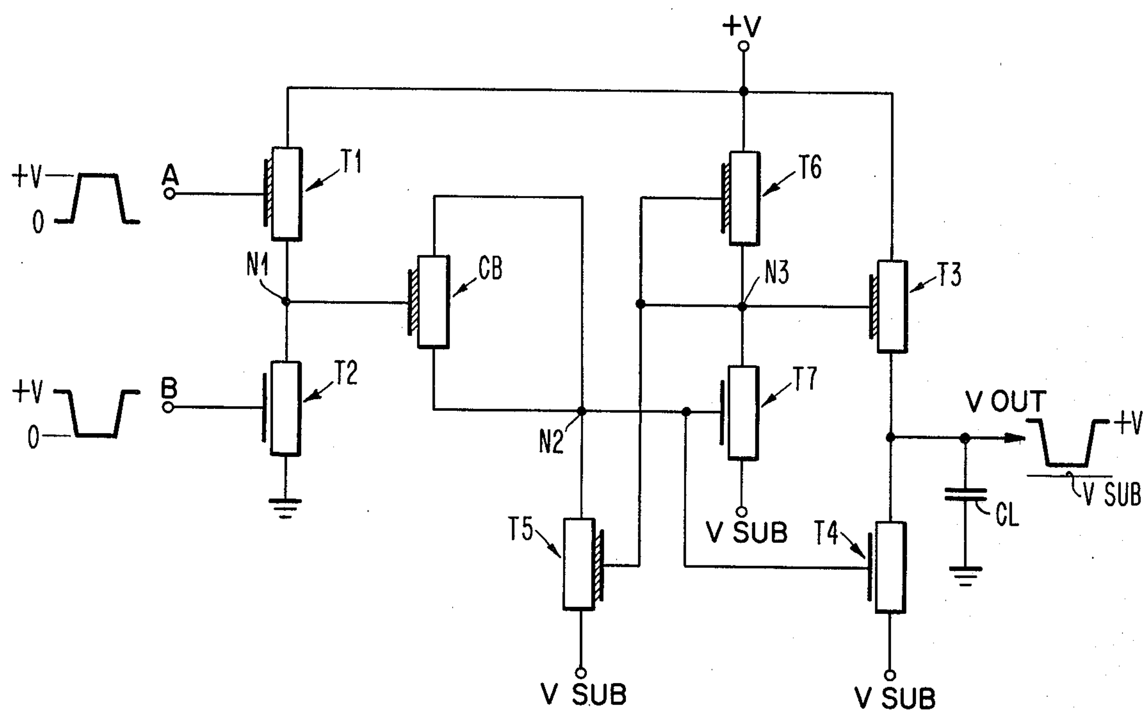
FIG. 1 is a circuit diagram of a preferred embodiment of this invention.

Refer now to FIG. 1 for a preferred embodiment of the present invention. Illustrated is a circuit having field effect transistor devices of both enhancement mode and depletion mode. An input stage is formed by depletion mode transistor T1 connected in series with enhancement mode transistor T2. All transistors are n-channel type although those skilled in the art could fabricate the same circuit from p-channel field effect transistors. The drain of T1 is connected to a first source of potential +V, while the source of T2 is connected to a second source of potential, designated as ground potential. The source of T1 is electrically in common with the drain of T2 forming node N1. The gate of T1 receives one phase of an input signal (e.g. the true phase) while the gate of T2 receives the complement of the input signal. Typically, a logic down level will be near ground potential while a logic up level will be near +V.

An output stage has at least a second pair of field effect transistors T3 and T4. T3 is a depletion mode device having its drain connected to +V and its source connected to the drain of T4, forming an output node. T4 is an enhancement mode device that has its source electrode connected to the substrate from which there is derived a third source of potential that is more negative than ground potential. Capacitor CL connected to the output node symbolizes the load capacitance of subsequent stages.

In order to connect the input stage with the output stage, coupling means consisting of transistors T5, T6, T7, and capacitor CB are provided. Transistors T5 and T6 are depletion mode while transistor T7 is enhancement mode. The drain of transistor T6 is connected to +V while the source is connected to the drain of T7 forming node N3. The source of T7 is connected to the substrate such that T6 and T7 form a third pair of field effect transistors and are connected between the first and third sources of potential. Capacitor CB is formed by a gate electrode connected to node N1 and a source/drain diffusion which is connected to node N2. CB is shown as a depletion mode field effect capacitor although an enhancement mode field effect capacitor can also be used. A depletion mode capacitor has an ion implanted region to make it depletion mode — by the same process rendering FET's depletion mode. A potential advantage of a depletion mode capacitor is that a signal is coupled over a wider range of voltages. Specifically, a signal is coupled even with zero gate to diffused semiconductor region bias. T5 has its drain to source path connected between N2 and the substrate and node N2 is also connected to the gate of T7 and the gate of T4. The gate electrodes of transistors T5, T6, and T3 are connected to node N3, as illustrated.

Figure 3:
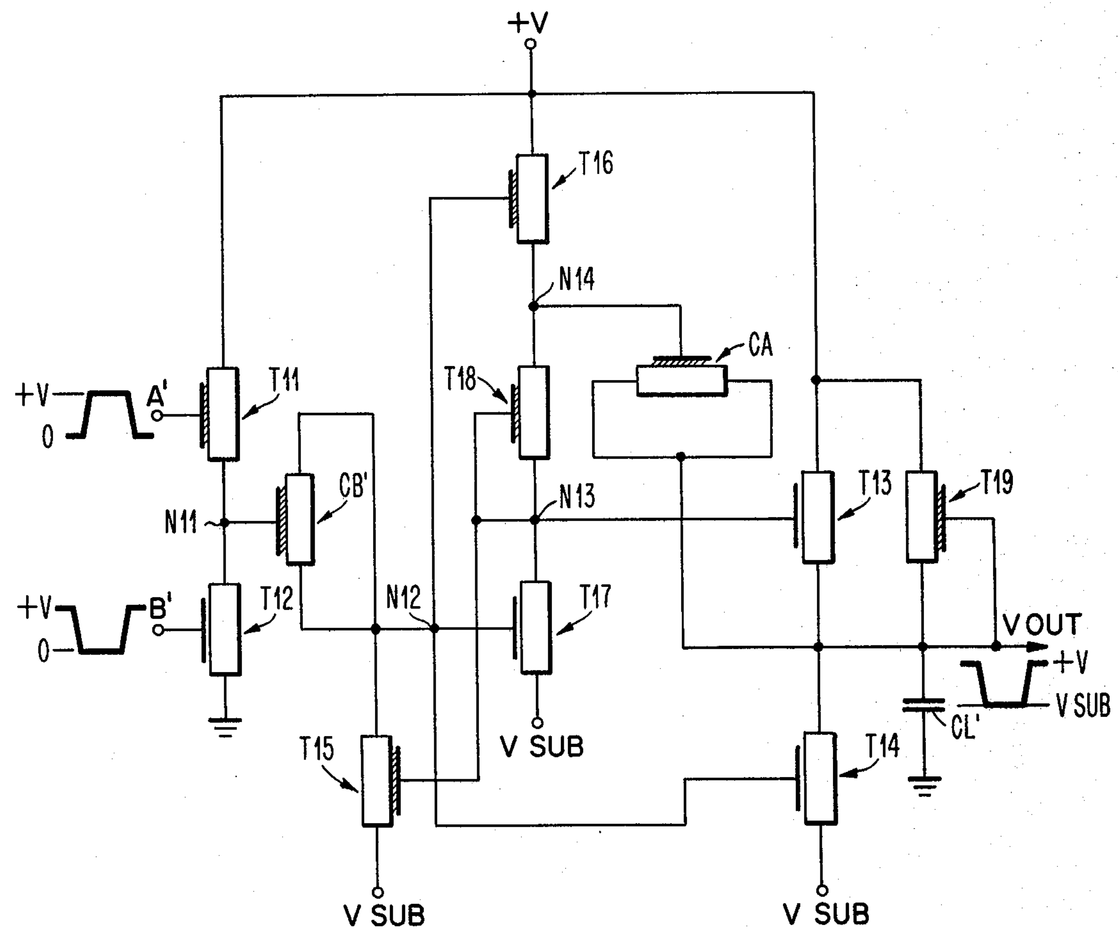
FIG. 3 is a circuit diagram of an alternate embodiment of this invention.

Refer now to FIG. 3 which is a circuit diagram illustrating an alternate embodiment of the invention. The input stage is similar to the FIG. 1 configuration and has depletion mode transistor T11 and enhancement mode transistor T12 connected in a series electrical path between +V and ground. The common connection at the source of T11 and drain of T12 forms node N11. True and complement values of the input signal are received at the gate electrodes of T11 and T12.

With continued reference to FIG. 3, it is noted that in this alternate embodiment, the output stage also has a pair of field effect transistors T13 and T14 connected in electrical series between the first and third sources of potential, +V and VSUB, respectively. In this alternate embodiment, however, both output transistors T13 and T14 are enhancement mode as a result of a bootstrapping feature built into the coupling means, as well as, the D.C. pull-up feature, both these features to be described.

With continued reference to FIG. 3, the capacitance CB' is shown connected in a manner similar to the capacitance CB in FIG. 1, capacitively coupling node N11 to node N12. CB' is once again shown as a depletion mode field effect capacitor although an enhancement mode field effect capacitor may be used. Depletion mode transistor T15 has its drain connected to node N12 while its source is connected to the substrate. In this embodiment, the third pair of field effect transistors (T6 and T7 in FIG. 1) is replaced by a plurality of series connected transistors T16, T17, and T18. T16 is a depletion mode device having its drain connected to +V while its source is connected to the drain of T18 forming node N14. T18 is a depletion mode device and has its source connected to the drain of T17 forming node N13. T17 is an enhancement mode device that has its source connected to the substrate. As was previously explained, the substrate forms a third potential that is more negative than ground. The gate electrodes of T16, T17 and T14 are connected in common and to node N12. Transistor T18 is self-biased and has its gate electrode connected to node N13 as is the gate electrode of T15 and T13. Additionally, bootstrap capacitor CA (a depletion mode field effect capacitor) is connected between the output node formed by the common connection of the source of T13 and the drain of T14 and node N14 formed by the common connection of the source of T16 and the drain of T18. As previously mentioned, an enhancement mode capacitor will also provide the desired capacitance. The gate portion of capacitor CA is connected to node N14 while the source/drain diffusion region is connected to the output node. Note the feedback path from the output node through capacitance CA to node N14 through transistor T18 to node N13 and the gate of T13. The capacitance CL' is indicative of the load capacitance of subsequent stages. As a further element in the FIG. 3 embodiment, transistor T19 is a small depletion mode device having its drain connected to +V and its source connected to the output node. The gate of T19 is also connected to the output node so that T19 is in a self-biased configuration. In the event of a very long pulse duration, transistor T19 maintains the up level of the output.

Those skilled in the art are aware of the various considerations in determining the width to length ratio that is to be attributed to a particular field effect transistor. Generally, a device having a small width to length ratio occupies a minimum area on the semiconductor surface, and is characterized by low input capacitance and low current carrying capability. Conversely, a device with a high width to length ratio can carry a large amount of current, at a higher input capacitance, and occupies a greater area on the surface of the semiconductor. By way of example, and without intending to limit in any way, typical ranges of width to length ratios for the circuit of FIG. 1 are shown in the following Table 1:

| TRANSISTOR | WIDTH/LENGTH RATIO |
|---|---|
| T1 | 10:1 |
| T2 | 20:1 |
| T3 | 20:1 |
| T4 | 85:1 |
| T5 | 1:50 |
| T6 | 2.5:1 |
| T7 | 10:1 |

Capacitance CB could have a value of approximately 7.5pf and capacitance CL might typically be in the order of 10pf.

For the FIG. 3 circuit, the following Table 2 is exemplary:

| TRANSISTOR | WIDTH/LENGTH RATIO |
|---|---|
| T11 | 10:1 |
| T12 | 20:1 |
| T13 | 60:1 |
| T14 | 85:1 |
| T15 | 1:50 |
| T16 | 12:1 |
| T17 | 9:1 |
| T18 | 3:1 |
| T19 | 1:1 |

Capacitances CB' and CL' would have values similar to CB and CL previously noted while feedback capacitor CA would have a value of approximately 3-4pf.

It is noted that the circuit of FIG. 3 requires somewhat more layout area than that of FIG. 1 due to the additional devices T18, T19, and CA as well as the larger area required for T13. To balance this disadvantage, the circuit of FIG. 3 requires and dissipates less D.C. power, and provides a full V SUB down level.

It is again pointed out that those skilled in the art are fully aware of the various process variations and specialized requirements which cause the tailoring of width to length ratios of the various devices for each specific process and application. The foregoing tables are therefore given to point out that in integrated circuit technology, the amount of space occupied by a particular circuit is significantly affected by the size of the individual devices, possibly more so than the actual device count. Also pointed out is the fact that in the herein circuit, the input capacitance to a device such as T1, T2, T11, or T12, is relatively low placing no special requirements on the output of the preceding circuit stage. This, of course, would not be the case if the input were connected directly to a relatively large device such as T4 or T14.

In operation, the present circuit provides pulse signals suitable to turn off depletion as well as enhancement mode devices in subsequent circuit stages. The use of depletion mode devices is desirable because they permit the charging of nodes to the +V supply voltage when their gate electrodes are brought to +V. Conversely, with enhancement mode devices, a node can only be charged to one threshold drop below +V. The advantage of depletion mode devices is particularly noticeable in memory cell and memory peripheral circuits such as restore devices for bit lines, decoders, latches, and other circuits having the function of charging up a node quickly to the +V supply, and then turning off quickly as if they were no longer in the circuit. When these restore type circuits are built out of enhancement mode devices, a number of problems arise. For example, a node can only be charged to one threshold drop below +V. Secondly, the restore devices operate as source followers and become very slow for the latter half of the node transition.

Another desirable feature of the present circuit is a very fast down going transition. This is particularly advantageous when the present circuit is utilized to turn off "precharge devices" in monolithic semiconductor memories. Such precharge devices are normally utilized to equalize bit lines prior to memory selection. However, immediately upon the occurrence of a selection pulse, it is desired to quickly turn off the precharge devices as is advantageously accomplished by the present circuit.

Figure 2:
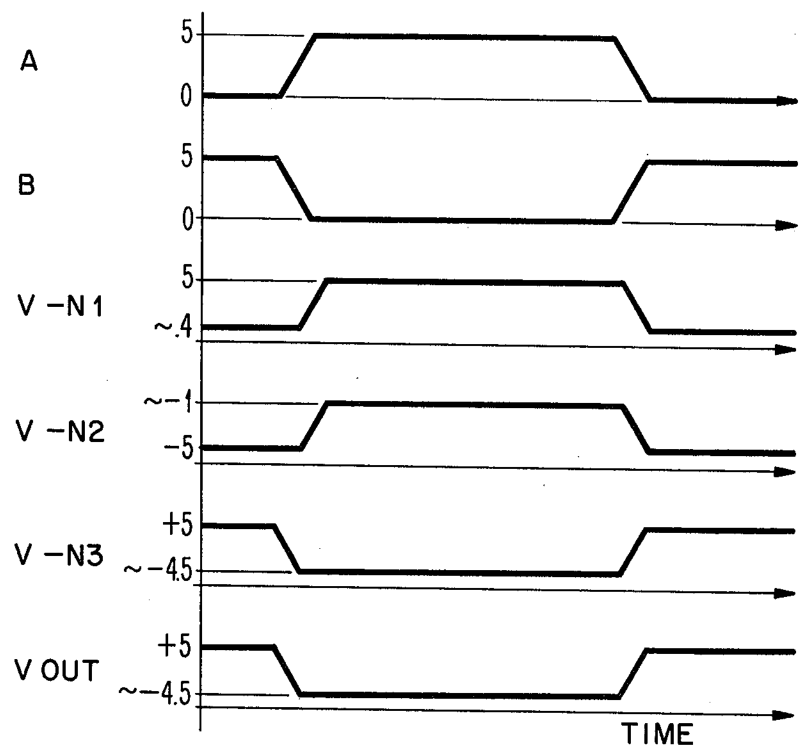
FIG. 2 is a waveform diagram illustrating the operation of the circuit of FIG. 1.

With continued reference to FIG. 1 and also referring to FIG. 2, the operation of the FIG. 1 circuit will be described. In the present configuration, the input signals will have a down logic level of ground potential and an up logic level of +V. At the output, up logic levels will be at +V while down logic levels will be at (or near) the substrate potential (V SUB). By way of example assume a +V potential of approximately +5 volts and a substrate potential of approximately −5 volts. The inputs at terminals A and B are intended to be complementary for true push-pull operation of the input stage. The input at terminal A could be a chip select (CS) pulse while the input at terminal B would be the NOT chip select pulse, when the present circuit is used in conjunction with a monolithic semiconductor memory. The up level input at terminal A turns T1 fully on while the down level input at terminal B turns T2 fully off bringing the potential at node N1 to +V. Note that the potential at node N1 never reaches ground potential because the down level input to terminal A never turns T1 fully off.

The signal at node N1 is capacitively coupled to node N2. Since node N2 was previously held at the substrate potential of approximately −5 volts, the capacitively coupled signal which has an amplitude of almost 5 volts (4.6 volts) brings the potential at node N2 near −1 volt. (Assuming a loss of 0.6 volts through capacitor CB, in the present example, node N2 will be brought to approximately −1 volt.) This provides a gate to source bias of approximately 4 volts to transistor T7 which turns on, bringing node N3 to a potential level that is near the substrate voltage. Node N3 is not brought all the way down to V SUB because of current through depletion mode device T6. In the present example, assuming the substrate voltage is at −5 volts, node N3 will be brought to approximately −4.5 volts. Simultaneously with the turning on of T7, T4 is turned on discharging the load capacitance CL bringing the output node near the substrate potential. Node N3 being at −4.5 volts turns T3 to its low conduction (high impedance) state, but since T3 is a depletion mode device, some current continues to be conducted. For this reason the output node will not be completely at substrate potential but will also be at approximately −4.5 volts. This provides a D.C. path from +V to the substrate voltage through T3 and T4, an undesirable feature (in some applications) that is overcome by the FIG. 3 embodiment.

At the termination of the up level input pulse at terminal A and the down level input at terminal B, T2 is turned on again while T1 is substantially turned off. This brings node N1 to approximately 0.4 volts near ground potential. This negative going transition is capacitively coupled through capacitor CB to node N2 which is brought back down to the substrate potential of −5 volts turning T7 and T4 off. As T7 turns off, node N3 is charged to +V through T6 turning T5 fully on thereby maintaining node N2 at the substrate potential. It is an important function of T5 to maintain node N2 at the substrate potential in order to maintain the approximately 5 volt bias across capacitor CB. Node N3 being charged to +V also turns T3 fully on bringing the output node to +V charging the load capacitance CL to +V.

Refer now to FIG. 3 which illustrates how with a few additional devices, the power consumption of the circuit of FIG. 1 is substantially reduced. Assume comparable potential up and down levels to those described in FIG. 1. A complementary input signal at terminals A′ and B′ with an up level signal at A′ occurring simultaneously with a down level signal at B′ turns T11 fully on, turns T12 fully off bringing node N11 to +V. This up level signal is capacitively coupled to node N12. Assuming that +V is approximately 5 volts, then the up going transition is almost 5 volts bringing node N12 from substrate potential (approximately −5 volts) to near ground potential. This turns T14 and T17 on, and also turns T16 fully on. T14 turning on discharges the output load capacitance CL′ to the substrate potential. T17 turning on brings node N13 to near substrate potential (except for whatever current passes from +V through depletion mode devices T16 and T18), turning T13 fully off. At this point in time there is no D.C. path from +V to the substrate other than through depletion mode device T19 which is made such a small device as to pass negligible current in terms of power consumption and through the T16, T18, and T17 series combination.

As the input at terminal A' is brought to a down level while the input at terminal B' is brought to an up level, T11 is placed in its low conductive state and T12 is turned fully on. This brings node N11 from +V to near ground potential in view of a small current through T11. This negative transition is capacitively coupled through capacitance CB' to node N12 bringing node N12 back to near substrate potential thereby turning off T14, T16 and T17. T15 is turned fully on by the up level at node N13, thereby assuring that node N12 will remain near V SUB, thus maintaining the 5 volt bias across capacitor CB'. It is here noted that, as in the case in FIG. 1 embodiment, the potential across CB' is either OV to V SUB or +V to OV. It is noted that at this point node N14 was charged to and held at nearly +V by virtue of the current through T16. As T14 is turned off, the output node begins to rise and this output transition is coupled through bootstrap capacitor CA to node N14 bringing it to a potential greater than +V. This potential is transmitted through T18 to node N13 bringing the gate electrode of T13 to higher than +V. In the steady state, as the output node rises to +V, node N14, node N13 and the gate of T13 are brought to a potential higher than +V permitting the output node to charge to a full +V potential in accordance with well-known bootstrapping principles. If a very long pulse duration is encountered, transistor T19 provides sufficient current to the output node to maintain it at +V in the event the potential at node N13 decays to or below +V.

What has then been described is a circuit for turning off depletion mode field effect transistor devices quickly and completely. In the case where such depleton mode devices would be precharge devices in a monolithic depletion the presently described circuits would function as the restore generator providing a sufficiently negative voltage on the down level to turn depletion mode devices completely off, thereby eliminating D.C. current drain, ratio requirement problems, and excessive power dissipation in the memory peripheral circuits. As was described, in the FIG. 1 embodiment, during the down level output a relatively high power is consumed. Should this not be desired, the FIG. 3 embodiment consumes significantly less power by the use of several additional devices.

In conclusion, the present circuit is an improved enhancement/depletion mode FET circuit for providing a potential sufficiently low to turn off depletion mode devices. While the invention has been particularly shown and described with reference to preferred embodiments, it will be understood by those skilled in the art that various changes in form and detail may be made therein without departing from the spirit and scope of the invention.

What is claimed is:

1. A field effect transistor circuit, formed on a semiconductor substrate comprising:

first, second, and third sources of potential having potentials of unequal magnitude;

an input stage having at least a first pair of field effect transistors connected in electrical series between said first and second sources of potential;

an output stage having at least a second pair of field effect transistors connected in electrical series between said first and third sources of potential; and means coupling said input stage to said output stage having at least a third pair of field effect transistors connected in electrical series between said first and third sources of potential;

said input stage having an output from a circuit point between said first pair of field effect transistors to said means coupling, and also electrically coupled to at least one of said third pair of field effect transistors;

said means coupling having an output electrically coupled from a circuit point between said third pair of field effect transistors to at least one of said second pair of field effect transistors;

whereby a binary logic signal having stable potential levels approximating said first and second sources of potential, applied to said input stage, provides a binary logic output signal having stable potential levels approximating said first and third sources of potential at an output of said output stage, said third source of potential being derived from the substrate.

2. A field effect transistor circuit as in claim 1 wherein said means coupling said input stage to said output stage further comprises:

a capacitor coupling said input stage to both said output stage and one of said third pair of field effect transistors; and a depletion mode field effect transistor having its drain to source path connected between said capacitor and said third source of potential at a circuit point between said capacitor and said output stage.

3. A field effect transistor circuit as in claim 2 wherein said capacitor comprises:

a gate region connected to said input stage; and at least one doped semiconductor region connected to said output stage and said one of said third pair of field effect transistors;

the gate region of the capacitor being biased positively with respect to the at least one doped semiconductor region so as to maintain an inverted region under the gate.

4. A field effect transistor circuit as in claim 3 wherein said depletion mode field effect transistor has its drain diffusion in electrical common with said at least one doped semiconductor region of said capacitor.

5. A field effect transistor circuit as in claim 1 wherein said at least third pair of field effect transistors comprises:

a first field effect transistor that is enhancement mode and a second field effect transistor that is depletion mode, each one of said transistors having a drain region, a source region, and a gating electrode, the drain region of said depletion mode field effect transistor being connected to said first source of potential, the source region of said enhancement mode field effect transistor being connected to said third source of potential, the source region of said depletion mode field effect transistor being electrically in common with the drain region of said enhancement mode field effect transistor and electrically coupled to said circuit point between said third pair of field effect transistors providing an output for coupling said at least third pair of field effect transistors to said output stage.

6. A field effect transistor circuit as in claim 5 wherein said output stage having at least a second pair of field effect transistors comprises:

a third field effect transistor of the depletion mode, a fourth field effect transistor of the enhancement mode, each said transistor having a drain region, a source region, and a gating electrode, the drain region of said third depletion mode field effect transistor being connected to said first source of potential, the source region of said fourth enhancement mode field effect transistor being connected to said third source of potential, the drain region of said fourth enhancement mode field effect transistor being in electrical common with the source region of said third depletion mode field effect transistor forming an output for the circuit;

the gate of said fourth enhancement mode field effect transistor being connected to the gate of said first enhancement mode field effect transistor of said third pair of field effect transistors; and the gate of said third depletion mode field effect transistor being connected to said electrically common region formed by the drain of said first enhancement mode field effect transistor and the source of said second depletion mode field effect transistor of said third pair of field effect transistors.

7. A field effect transistor circuit as in claim 5 wherein said means coupling said input stage to said output stage further comprises:

a capacitor coupling said input stage to both said output stage and one of said at least third pair of field effect transistors; and a depletion mode third field effect transistor having its drain to source path connected between said capacitor and said third source of potential at a circuit point between said capacitor and said output stage.

8. A field effect transistor circuit as in claim 7 wherein said capacitor comprises:

a gate region connected to said input stage; and at least one doped semiconductor region connected to said output stage and said one of said at least third pair of field effect transistors;

the gate region of the capacitor being biased positively with respect to the at least one doped semiconductor region so as to maintain an inverted region under the gate.

9. A field effect transistor circuit as in claim 8 where said depletion mode third field effect transistor has its drain diffusion in electrical common with said at least one doped semiconductor region of said capacitor.

10. A field effect transistor circuit as in claim 1 wherein said input stage having at least a first pair of field effect transistors comprises:

an enhancement mode device and a depletion mode device each having a drain region, source region and a gate, the drain region of said depletion mode device being connected to said first source of potential, the source region of said enhancement mode device being connected to said second source of potential, the source region of said depletion mode device being in electrical common with the drain region of said enhancement mode device and electrically connected to said means coupling said input stage to said output stage.

11. A field effect transistor circuit as in claim 10 wherein the gate region of said depletion mode device is connected to a logic input signal having steady state levels approximating said first and second sources of potential, the gate of said enhancement mode device being connected to the complement of said input signal.

12. A field effect transistor circuit as in claim 1 wherein said at least third pair of field effect transistors comprises:

a first field effect transistor device that is depletion mode, a second field effect transistor device that is depletion mode, a third field effect transistor device that is enhancement mode, each one of said transistor devices having a drain region, a source region, and a gating electrode, the drain region of said first depletion mode field effect transistor device being connected to said first source of potential, the drain region of said second depletion mode field effect transistor device being connected to the source region of said first field effect transistor device, the drain region of said third enhancement mode field effect transistor device being connected to the source region of said second depletion mode field effect transistor device, the source region of said third enhancement mode field effect transistor device being connected to said third source of potential the connection between the source region of the second field effect transistor device and the drain region of the third field effect transistor device forming the output for coupling said at least third transistor pair of field effect transistors to said output stage.

13. A field effect transistor circuit as in claim 12 further comprising:

a bootstrap capacitor connected between the output stage and a common region formed by the connection of the source region of said first depletion mode field effect transistor device and the drain region of said second depletion mode field effect transistor device.

14. A field effect transistor circuit as in claim 13 wherein said bootstrap capacitor comprises:

a gate region connected to the common connection formed by the source region of said first depletion mode field effect transistor device and the drain region of said second depletion mode field effect transistor device; and at least one doped semiconductor region connected to said output stage.

15. A field effect transistor circuit as in claim 12 wherein said output stage having at least a second pair of field effect transistors comprises:

a fourth field effect transistor device of the enhancement mode, a fifth field effect transistor of the enhancement mode, each said transistors having a drain region, a source region, and a gating electrode, the drain region of said fourth enhancement mode field effect transistor device being connected to said first source of potential, the source region of said fifth enhancement mode field effect transistor device being connected to said third source of potential, the drain region of said fifth enhancement mode field effect transistor device being in electrical common with the source region of said fourth enhancement mode field effect transistor device forming an output for the circuit;

the gate of said fifth enhancement mode field effect transistor device being connected to the gate of said third enhancement mode field effect transistor device of said at least third pair of field effect transistors; and the gate of said fourth enhancement mode field effect transistor device being connected to an electrically common region formed by the drain of said third enhancement mode field effect transistor device and the source of said second depletion mode field effect transistor device of said at least third pair of field effect transistors.

16. A field effect transistor circuit as in claim 15 wherein said output stage additionally comprises:

a sixth field effect transistor device of the depletion mode having its drain connected to said first source of potential, its source connected to said output, and its gating electrode connected to said output.

17. A field effect transistor circuit as in claim 12 wherein said input stage having at least a first pair of field effect transistors comprises:

an enhancement mode device and a depletion mode device each having a drain region, source region and a gate, the drain region of said depletion mode device being connected to said first source of potential, the source region of said enhancement mode device being connected to said second source of potential, the source region of said depletion mode device being in electrical common with the drain region of said enhancement mode device and electrically connected to said means coupling said input stage to said output stage.

18. A field effect transistor circuit as in claim 17 wherein the gate region of said depletion mode device is connected to a logic input signal having steady state levels approximating said first and second sources of potential, the gate of said enhancement mode device being connected to the complement of said input signal.

* * * * *